United States Patent
Tokuhisa et al.

(10) Patent No.: US 6,984,714 B2
(45) Date of Patent: Jan. 10, 2006

(54) SILOXANE-MODIFIED POLYIMIDE RESIN

(75) Inventors: Kiwamu Tokuhisa, Chiba (JP); Hongyuan Wang, Chiba (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 38 days.

(21) Appl. No.: 10/420,858

(22) Filed: Apr. 23, 2003

(65) Prior Publication Data

US 2003/0212245 A1 Nov. 13, 2003

(30) Foreign Application Priority Data

May 13, 2002 (JP) .............................. 2002-137542

(51) Int. Cl.
*C08G 69/26* (2006.01)
*C08G 73/10* (2006.01)

(52) U.S. Cl. .................... 528/332; 528/10; 528/33; 528/38; 528/172; 528/173; 528/183; 528/188; 528/220; 528/229; 528/350; 528/353; 524/600; 524/602; 428/473.5

(58) Field of Classification Search ............... 528/10, 528/33, 38, 353, 172–173, 229, 350, 183, 528/188, 220; 428/473.5; 524/600, 602
See application file for complete search history.

(56) References Cited

U.S. PATENT DOCUMENTS

| 4,975,331 | A |   | 12/1990 | Burgess et al. |
| 5,442,024 | A | * | 8/1995  | Kunimune et al. ........... 528/12 |
| 5,741,599 | A | * | 4/1998  | Oie et al. .................... 428/458 |
| 5,773,509 | A | * | 6/1998  | Yoshida et al. .............. 524/600 |
| 5,891,986 | A | * | 4/1999  | Yamaguchi et al. ......... 528/310 |
| 5,916,688 | A | * | 6/1999  | Tokuhisa et al. ............ 428/447 |
| 6,120,702 | A | * | 9/2000  | Miyamoto et al. ....... 252/299.4 |
| 6,235,867 | B1 | * | 5/2001 | Eguchi et al. ............... 528/170 |
| 6,288,209 | B1 | * | 9/2001 | Jensen ......................... 528/353 |
| 6,300,037 | B1 | * | 10/2001 | Fujii et al. ............... 430/270.1 |
| 2003/0212245 | A1 | * | 11/2003 | Tokuhisa et al. ........... 528/332 |

FOREIGN PATENT DOCUMENTS

| JP | 11-140184 | * | 5/1999 |
| JP | 11-255900 A1 |   | 9/1999 |
| JP | 11-310769 | * | 11/1999 |
| JP | 11-097482 | * | 10/2000 |
| JP | 2001-262116 A1 |   | 9/2001 |

* cited by examiner

*Primary Examiner*—P. Hampton Hightower
(74) *Attorney, Agent, or Firm*—Rader, Fishman & Grauer PLLC

(57) ABSTRACT

This invention relates to a siloxane-modified polyimide resin which shows excellent adhesiveness and can be bonded by thermocompression at high temperature even after subjection to thermal hysteresis in the manufacturing step for electronic parts. This polyimide resin is obtained from an aromatic tetracarboxylic acid dianhydride (A) and a diamine (B) comprising 30–95 mol % of a bis(4-aminophenoxy) alkane (B1) and 5–70 mol % of a siloxanediamine (B2) as essential components.

4 Claims, No Drawings

SILOXANE-MODIFIED POLYIMIDE RESIN

FIELD OF THE INVENTION

This invention relates to a siloxane-modified polyimide resin. Further, this invention relates to an adhesive polyimide resin which is useful for use as an intermetallic dielectric layer for wiring parts of printed circuit boards, die bonding material for semiconductor packages, heat-resistant adhesive for electronic materials and build-up insulating material.

DESCRIPTION OF RELATED ART

In recent years, keeping pace with the trend of electronic equipment toward smaller size and higher density, the scale of device integration on semiconductor chips is becoming increasingly larger. Following this trend, a variety of modes for packaging semiconductors have been proposed. For example, organic materials such as epoxy and polyimide resins or inorganic materials such as silica are used as insulating substrates of the packages. Furthermore, a, metal such-as copper, aluminum and gold is used as a conductor and a metal plate as a radiator. Under these circumstances, how to secure the adhesion of these materials of a different kind has become a critical factor influencing the reliability of the package as a whole.

On the other hand, in the step for manufacturing packages, an adhesive is sometimes applied to the surface of an adherend substrate in advance for improved workability. An adhesive to be used in this case is required to keep its properties unchanged when subjected to a treatment involving heat or chemicals during fabrication of the substrate. Moreover, since an adhesive of the kind to be used in the periphery of semiconductors goes through steps including reflow, it is equally important that the adhesive deteriorates little in its adhesive strength at high temperature and contains a minimal amount of volatiles responsible for contamination of circuits.

Adhesives used in the past for the aforementioned applications include thermosetting resins such as epoxy resins and acrylic resins and thermoplastic resins such as polyimide resins. Normally, the bonding step consists of forming an adhesive layer on one of the adherends or on he substrate and bonding the adhesive-coated substrate to the other adherend by the use of heat, pressure and the like. In the actual manufacturing step, however, the adhesive-coated substrate sometimes goes through a heating step for drying or preliminary heating prior to bonding. In case the adhesive-coated substrate goes through such a step, the aforementioned thermosetting resin cures readily and suffers marked deterioration in its properties as an adhesive. Now, to prevent the adhesive-coated substrate from going through the aforementioned step, it is necessary to coat the substrate with an adhesive varnish or to paste an adhesive film on the substrate immediately before bonding and a procedure such as this would markedly restrict the degree of freedom of operations.

The use of siloxanepolyimide resins having good adhesive properties as thermoplastic adhesive has been proposed in JP11-255900-A and elsewhere. Siloxanepolyimide resins, however, deteriorate markedly in modulus of elasticity when heated and they have presented a problem of peeling under heat.

As a remedial means, introduction of a crosslinking radical to a siloxanepolyimide resin is proposed in JP13-262116-A in order to improve the heat resistance. The method proposed here can surely stop deterioration of the modulus of elasticity at high temperature, but curing that is an irreversible reaction progresses as a result of heating applied at a number of places in the manufacturing step thereby deteriorating the adhesive properties. Like other thermosetting adhesives, the siloxanepolyimide resins in question have the possibility of greatly restricting the manufacturing step and the degree of freedom of operations.

SUMMARY OF THE INVENTION

An object of this invention is to provide an adhesive resin material which shows good flow during thermocompression bonding even after subjection to the aforementioned thermal hysteresis in the preliminary treatment for bonding of electronic parts, a high modulus of elasticity at high temperature, good adhesive strength to silicon, polyimide and a variety of metals and good heat resistance in reflow.

This invention relates to a polyimide resin which is obtained from an aromatic tetracarboxylic acid dianhydride (A) and a diamine (B) comprising 30–95 mol % of an aromatic diamine having an aliphatic straight chain (B1) represented by the following general formula (1) and 5–70 mol % of a siloxanediamine (B2) represented by the following general formula (2) as essential components.

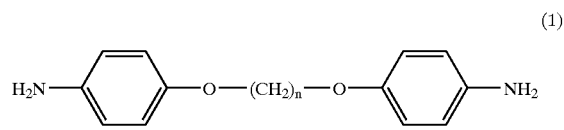

(1)

(wherein n is 3–10 denoting the average number of repeating units)

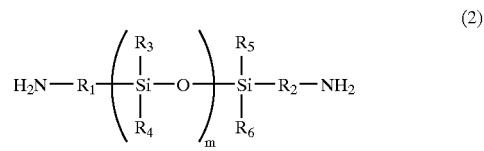

(2)

(wherein $R_1$ and $R_2$ are divalent hydrocarbon radicals, $R_3$–$R_6$ are hydrocarbon radicals containing 1–6 carbon atoms and m is 1–10 denoting the average number of repeating units).

This invention further relates to the aforementioned polyimide resin which has the following properties:
(1) The glass transition temperature is 30–200° C.;
(2) The Young's modulus (storage modulus) at 250° C. is $10^6$ Pa or more; and
(3) When a film of the polyimide is subjected to thermal hysteresis at 270° C. for 5 minutes and then bonded by thermocompression to the mirror-finished surface a silicon chip adherend at 320° C. and 2 MPa, the peel strength between the silicon chip adherend and the polyimide film at room temperature is 0.8 kN/m or more.

DETAILED DESCRIPTION OF THE INVENTION

Aromatic tetracarboxylic acid dianhydrides useful for the preparation of polyimide resins of this invention are not limited to specific ones and include pyromellitic acid dianhydride, 3,3',4,4'-benzophenonetetracarboxylic acid dianhydride, 2,2',3,3'-benzophenonetetracarboxylic acid dianhydride, 2,3,3',4'-benzophenonetetracarboxylic acid dianhydride, naphthalene-2,3,6,7-tetracarboxylic acid dianhydride, naphthalene-1,2,5,6-tetracarboxylic acid dianhydride, naphthalene-1,2,4,5- tetracarboxylic acid dianhydride, naphthalene-1,4,5,8-tetracarboxylic acid dianhydride, naphthalene-1,2,6,7-tetracarboxylic acid dianhydride, 4,8-dimethyl- 1,2,3,5,6,7-hexahydronaphthalene-1,2,5,6-tetracarboxylic acid dianhydride, 4,8-dimethyl-1,2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, 1,4,5,8-tetrachloronaphthalene-2,3,6,7-tetracarboxylic acid dianhydride, 3,3',4,4'-biphenyltetracarboxylic acid dianhydride, 2,2',3,3'-biphenyltetracarboxylic acid dianhydride, 2,3,3',4'-biphenyltetracarboxylic acid dianhydride, 3,3'',4,4''-p-terphenyltetracarboxylic acid dianhydride, 2,2'',3,3''-p-terphenyltetracarboxylic acid dianhydride, 2,3,3'',4''-p-terphenyltetracarboxylic acid dianhydride, 2,2-bis(2,3-dicarboxyphenyl)propane dianhydride, 2,2-bis(3,4-dicarboxyphenyl)propane dianhydride, bis(2,3-dicarboxyphenyl) ether dianhydride, bis(2,3-dicarboxyphenyl)methane dianhydride, bis(3,4-dicarboxylphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7-tetracarboxylic acid dianhydride, phenanthrene-1,2,9,10-tetracarboxylic acid dianhydride, cyclopentane-1,2,3,4-tetracarboxylic acid dianhydride, pyrazine-2,3,5,6-tetracarboxylic acid dianhydride, pyrrolidine-2,3,4,5-tetracarboxylic acid dianhydride, thiophene-2,3,4,5-tetracarboxylic acid dianhydride and 4,4'-oxydiphthalic acid dianhydride. The aforementioned carboxylic acid dianhydrides can be used singly or as a mixture of two kinds or more.

Preferable among the aforementioned examples are the ones chosen from pyromellitic acid dianhydride and those acid dianhydrides which are represented by $O(CO)_2 Ar—X—Ar(CO)_2 O$. In this formula, X is a direct bond, CO, O or $SO_2$ and Ar is a benzene ring or a benzene ring carrying a substituent, preferably a lower alkyl radical containing 1–4 carbon atoms, and one of two Ar's preferably has 0–2 substituents. More preferably, 4,4'-oxydiphthalic acid dianhydride (ODPA) or 3,3',4,4'-biphenyltetracarboxylic acid dianhydride (BPDA) is chosen because of its good solubility in organic solvents when it is made into a polyimide resin and good adhesiveness to an adherend such as copper.

Diamine (B) to be used in the preparation of the polyimide resins of this invention should comprise an aromatic diamine having an aliphatic straight chain (B1) represented by formula (1) and a siloxanediamine (B2) represented by general formula (2) as essential components from the viewpoint of satisfactory adhesiveness and heat resistance.

It is necessary here that the average number of repeating methylene radicals in aromatic diamine having an aliphatic straight chain (B1) must be in the range of 3–10. If n is short of 3, processability in film formation and lamination may deteriorate. If n exceeds 10, the modulus of elasticity may drop too much when the polyimide resin is made into an adhesive layer. Preferred examples of (B1) are 1,5-bis(p-aminophenoxy)pentane and 1,4-bis(p-aminophenoxy)butane.

In formula (2) representing siloxanediamine (B2), $R_1$ and $R_2$ are independently divalent hydrocarbon radicals, preferably alkylene or phenylene radicals, and the alkylene radicals contain 2–6, preferably 3–5, carbon atoms, $R_3$–$R_6$ are independently hydrocarbon radicals containing 1–6 carbon atoms, chosen preferably from methyl, ethyl, propyl and phenyl, and m is 1–10 denoting the average number of repeating units.

Concrete examples of siloxanediamine (B2) are ω, ω'-bis(2-aminoethyl) polydimethylsiloxane, ω, ω'-bis(3-aminopropyl)polydimethylsiloxane, ω, ω'-bis( 4-aminophenyl) polydimethylsiloxane, ω, ω'-bis(3-aminopropyl) polydiphenylsiloxane and ω, ω'-bis(3-aminopropyl)polymethylphenylsiloxane.

Aromatic diamine (B1) is used in an amount in the range of 30–95 mol %, preferably 40–70 mol %, of diamine (B). Less than 30 mol % of (B1) yields a polyimide resin of low heat resistance while more than 95 mol % of (B1) yields a polyimide resin of poor adhesiveness. Siloxanediamine (B2) is used in an amount in the range of 5–70 mol %, preferably 30–60 mol %, of diamine (B). Less than 5 mol % of (B2) yields a polyimide resin of poor adhesiveness while more than 70 mol % of (B2) yields a polyimide resin of low heat resistance. It is allowable to use diamines other than (B1) and (B2) or diamine (B3) if in a small amount.

The aforementioned other diamines or diamine (B3) are not specific and their examples include the following aromatic diamines: 3,3'-dimethyl-4,4'-diaminobiphenyl, 4,6-dimethyl-m-phenylenediamine, 2,5-dimethyl-p-phenylenediamine, 2,4-diaminomesitylene, 4,4'-methylenebis(o-toluidine), 4,4'-methylenebis(2,6-xylidine), 4,4'-methylenebis(2,6-diethylaniline), toluene-2,4-diamine, m-phenylenediamine, p-phenylenediamine, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 2,2-bis[4-(4-aminophenoxy)phenyl]propane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 3,3'-diaminobiphenyl, 3,3'-dimethyl-4,4'-diaminobiphenyl, 3,3'-dimethoxybenzidine, 4,4'-diamino-p-terphenyl, 3,3'-diamino-p-terphenyl, bis(p-aminocyclohexyl)methane, his (p-β-amino-t-butylphenyl) ether, bis(p-β-methyl-δ-aminopentyl)benzene, p-bis(2-methyl-4-aminopentyl) benzene, p-bis(1,1-dimethyl-5-aminopentyl)benzene, 1,5-diaminonaphthalene, 2,6-diaminonaphthalene, 2,4-bis(β-amino-t-butyl) toluene, 2,4-diaminotoluiene, m-xylene-2,5-diamine, p-xylene-2,5-diamine, m-xylylenediamine, p-xylenediamine, 2,6-diaminopyridine, 2,5-diaminopyridine, 2,5-diamino-1,3,4-oxadiazole, piperazine and 1,3-bis(3-aminophenoxy)benzene. These aromatic diamines may be used singly or as a mixture of two kinds or more. Of these examples, 2,2-bis[ 4-(4-aminophenoxy)phenyl]propane is most suitable as it is easy to use in the reaction because of its good solubility in organic solvents.

In case diamine (B3) is used, its suitable proportion is 0–30 mol %, preferably 0–15 mol %, of the whole diamine (B). The use of more than 50 mol % results in poor adhesiveness.

The polyimide resin of this invention preferably contains substantially no reactive groups for crosslinking in its raw material acid anhydrides and diamines and this makes it possible for the polymer to maintain good flow during processing even after subjection to thermal hysteresis prior to thermocompression bonding. The polyimide resin of this invention has excellent properties in respect to thermoplasticity and modulus of elasticity at high temperature as it contains a siloxanediamine and a diamine having an aliphatic straight chain as diamine components.

A method for preparing the polyimide resin of this invention will be described.

A method for polymerization applicable to the polyimide resin of this invention is not restricted to any specific one and a publicly known method may be used. An explanation will be given below to a method for preparing the precursor of a siloxanepolyimide resin (polyamic acid). Since the siloxanepolyimide precursor undergoes hydrolysis more easily and shows poorer storage stability in solution than the precursors of aromatic polyimide resins, it is desirable to imidize the polyamic acid segment to be formed by the reaction of an aromatic tetracarboxylic acid dianhydride with a siloxanediamine prior to the polymerization of an aromatic diamine having an aliphatic straight chain.

To be concrete, an aromatic tetracarboxylic acid dianhydride is dissolved or suspended in an organic solvent in advance and a siloxanediamine is added slowly to the solution or suspension. Thereafter, polymerization and imidation are carried out at 150–210° C. for 10–24 hours with removal of the condensed water to give a siloxanepolyimide oligomer having terminal acid anhydride groups. The reaction mixture is then cooled to near room temperature, an aromatic diamine having an aliphatic straight chain or a mixture thereof with other diamine (B3) is added so that the acid anhydride becomes roughly equimolar to the total diamines and the resulting mixture is allowed to react at 10–80° C. for 1–3 hours to give a solution of the polyimide precursor.

There is no specific restriction on solvents to be used in the aforementioned reaction and those solvents which are capable of dissolving the main component of a resin composition may be used singly or as a mixture of two kinds or more; for example, phenols, amides (based on pyrrolidone or acetamide), oxanes (dioxane and trioxane), ketones (cyclohexanone) and glymes (methyl diglyme and methyl triglyme). A mixture of the foregoing with an aromatic hydrocarbon solvent such as benzene and toluene or an aliphatic hydrocarbon solvent such as hexane and decane may be used as occasion demands provided the amount of the hydrocarbon solvent is in such a range as to a homogeneous solution when mixed. From the viewpoint of reducing the reaction time and preventing loss of the solvent by evaporation, a solvent boiling at 150° C. or above is preferable and an organic polar solvent boiling at 200° C. or above (for example, N-methyl-2-pyrrolidinone and methyl triglyme) are most preferable.

The molecular weight of polyimide resin can be controlled by controlling the molar ratio of monomers as in the preparation of polymers by ordinary polycondensation. It is preferable to use 1 mole of a mixture of aromatic tetracarboxylic acid dianhydrides and 0.8–1.2 moles of a mixture of diamines. If this molar ratio is either below 0.8 or above 1.2, every product has a low molecular weight and is devoid of satisfactory heat resistance. The ratio of 1 mole of a mixture of aromatic tetracarboxylic acid dianhydrides to 0.95–1.05 moles of a mixture of diamines is more preferable and the ratio of 1 mole of a mixture of aromatic tetracarboxylic acid dianhydrides to 0.98–1.02 moles of a mixture of diamines is most preferable.

The polyimide precursor resin solution resulting from polymerization in solution is applied to a substrate of choice, dried preliminarily at 150° C. or below for 10–30 minutes, stripped of the solvent, and submitted to a heat treatment normally at 180–270° C. for 2–30 minutes to effect imidation to give the polyimide resin of this invention. Where there is no need for converting the polyimide resin into a film, the polyimide precursor resin solution is stripped of the solvent by a suitable method and submitted to a heat treatment to give the polyimide resin of this invention. Moreover, it is possible to complete the imidation in solution and obtain the polyimide resin of this invention as a solution.

The polyimide resin of this invention performs excellently as an adhesive and, in case it is used as an adhesive, the polyimide precursor resin solution or the polyimide resin solution is preferably formed into a film with a thickness of 10–100 $\mu$m before use. An adhesive polyimide resin in the form of a film is suitable for applications relating to electronic parts. To form a film, the polyimide precursor resin solution or polyimide resin solution is applied to a substrate chosen from releasable materials such as glass plate and release film, dried, cured and peeled off. It is also possible to apply the polyimide precursor resin solution or polyimide resin solution directly to the adherend constituting an electronic part and submitted to a heat treatment to form an adhesive layer.

The imidation is substantially complete after the aforementioned beat treatment at 180° C. or above, but it is preferable to give a further heat treatment at 270° C. for 1–5 minutes in order to insure complete imidation and removal of low-molecular-weight components. Whether the imidation is complete or not can be confirmed by determining the degree of imidation. The degree of imidation can be determined by infrared absorption spectrometry and the completely imidized polymer shows substantially no absorption band attributable to the amide linkage and shows only absorption bands attributable to the imide ring formed by ring closure in imidation.

The polyimide resin of this invention is characterized by retaining adhesiveness even after subjection to thermal hysteresis at high temperature, for example, at 270° C. or so. Therefore, it is used as an adhesive polyimide resin. In the case of its use as an adhesive, the polyimide resin after imidation and a thermal treatment at 320° C. for 10 seconds should preferably shows a glass transition temperature in the range of 30–200° C. and a Young's modulus (storage modulus) at 250° C. of $10^6$ Pa or more. Where the Young's modulus at 250° C. is less than $10^6$ Pa, there is a strong possibility of blistering and delamination in the infrared reflow step.

The glass transition temperature of polyimide resins is preferably in the range of 30–200° C. , more preferably in the range of 80–150° C. . The glass transition temperature here refers to the one determined by dynamic mechanical analysis (DMA). When the glass transition temperature falls below 30° C. , the film deteriorates markedly in its mechanical strength near room temperature and presents a problem in respect to heat resistance in reflow. On the other hand, a polyimide resin with a glass transition temperature in excess of 200° C. does not show satisfactory flow properties to develop a sufficient bonding strength at a temperature regarded as practical for thermocompression bonding and requires a higher temperature thereby causing considerable damages to the peripheral materials and the polyimide resin itself.

Furthermore, when subjected to thermal hysteresis at 270° C. for 5 minutes and then bonded by thermocompression to a silicon chip adherend at 320° C. and 2 MPa, the adhesive polyimide resin of this invention must develop a 90° peel strength of 0.8 kN/m or more, preferably 1.5 kN/m or more, at room temperature between the silicon chip adherend and the adhesive polyimide layer.

The adherend to which the adhesive polyimide resin of this invention is applied is not limited to silicon chips. That is, what is required for the polyimide resin in this invention is to have the aforementioned properties and the adherends are not restricted and include silicon chips, copper foils, and other electronic parts.

The detailed conditions for determining the glass transition temperature, Young's modulus (storage modulus) and adhesive strength in this invention are described in the examples.

The glass transition temperature, Young's modulus (storage modulus) and peel strength against the adherend of the polyimide resin of this invention can be controlled by controlling the molar ratio of raw material monomers. That is, these properties are controlled by suitably selecting the aforementioned tetracarboxylic acid dianhydrides and diamines. The controlled use of diamine (B) comprising an aromatic diamine having an aliphatic straight chain (B1) and a siloxanediamine (B2) at a specified ratio gives a polyimide resin which has a specified glass transition temperature and Young's modulus (storage modulus) and shows improved adhesiveness against silicon substrates and metals. Likewise, the aforementioned properties can be controlled by suitably selecting tetracarboxylic acid dianhydrides.

An adhesive film formed from the polyimide resin of this invention is thermoplastic, yet it has a special property of high modulus of elasticity, particularly at high temperature. On account of its satisfactory flow properties during thermocompression bonding and retention of heat resistance in reflow after curing, it is suitable for a film substrate for semiconductor packages which is to be subjected to a plenty of thermal hysteresis in the steps for forming circuits and assembling semiconductors. For example, formation in advance of a metal bump through which a layer of the polyimide resin of this invention is pierced for a bumped silicon wafer facilitates bonding or fixing to a wiring board. It is also possible for the polyimide resin to show sufficient flow properties during thermocompression bonding even after subjection to thermal hysteresis.

It is allowable to incorporate a suitable amount of publicly known coupling agents, fillers, pigments, thixotropic agents and antifoaming agents in the polyimide resin of this invention. These additives preferably do not decompose or evaporate at a temperature on the order of 300° C. The adhesive polyimide resin of this invention can be used in admixture with the aforementioned additives and other resins and, in the case of mixed use, the amount of other resins is kept at 30% by weight or less, preferably 20% by weight or less.

When the polyimide resin of this invention is mixed with a pigment and used as a coating resin on IC and LSI, the resin or its film not only inhibits transmission in the infrared and ultraviolet regions thereby playing a role of preventing malfunctioning due to such transmission but also provides good laser marking quality by $CO_2$, YAG and green lasers. In this case, a preferred pigment is carbon black and a preferred formulation is 99.5–90% by weight of the polyimide resin of this invention and 0.5–10% by weight of carbon black. Less than 0.5% by weight of carbon black yields a weak tinting power and lacks sufficient ability to shut off light with a wavelength of 350–3,000 nm thereby developing the possibility of malfunctioning. More than 10% by weight of carbon black occupies a larger volume and the surface of the resin becomes rough. The average particle diameter of carbon black is preferably 50–400 nm, more preferably 250–350 nm.

A method for bonding electronic parts by the use of the adhesive polyimide resin of this invention will be explained below. First, a solution of polyimide resin is made ready. This is a solution of a polyimide resin or its precursor obtained by the reaction of an aromatic tetracarboxylic acid dianhydride (A) with a diamine (B) comprising an aromatic diamine having an aliphatic straight chain (B1) and a siloxanediamine (B2) as essential components. The solution is applied to a supporting substrate, preliminarily dried at 150° C. or below for 10–30 minutes to drive off the solvent and, in case the solution is that of the polyimide precursor, submitted to a heat treatment at 180–270° C. for 2–30 minutes to effect imidation.

The polyimide resin obtained in this manner is used as an adhesive layer in the bonding operation as follows: (1) a wiring board or a silicon wafer as a supporting substrate is coated by the adhesive polyimide resin and the adhesive-coated substrate is bonded directly to other electronic parts under heat and pressure; (2) the adhesive polyimide resin is formed into a film and the film is placed between a substrate and an adherend and bonded together under heat and pressure.

PREFERRED EMBODIMENTS OF THE INVENTION

This invention will be described concretely below with reference to the examples and comparative examples, but it will not be limited thereto.

The symbols used in the examples denote the following compounds.

PSX: ω, ω'-bis(3-aminopropyl)polydimethylsiloxane (average number of siloxane units n=7.98; average molecular weight, 766)

PSX (n=1): ω, ω'-bis(3-aminopropyl)dimethylsiloxane (number of siloxane units n= 1; molecular weight, 248.52)

ODPA: 3,3',4,4'-oxydiphthalic acid dianhydride

BPDA: 3,3',4,4'-biphenyltetracarboxylic acid dianhydride

DA5MG: 1,5-bis(p-aminophenoxy)pentane

DA4MG: 1,4-bis(p-aminophenoxy) butane

BAPP: 2,2-bis[4-(4-aminophenoxy)phenyl]propane

DAPE: 4,4'-diaminodiphenyl ether

EPPN-502H: polyfunctional epoxy resin (available from Nippon Kayaku Co., Ltd.)

Determination of Glass Transition Temperature Tg and Young's Modulus E'

The resin solution obtained in each of Synthesis Examples was applied to a releasable PET substrate (thickness 38 μm), preliminarily dried in a hot-air oven at 80° C. for 15 minutes, and subjected to a heat treatments successively at 140° C., 180° C. and 270° C. respectively for 5 minutes and at 320° C. for 10 seconds to give a resin film with a thickness of approximately 60 μm. The film was measured for the dynamic viscoelasticity by DMA while raising the temperature from 0° C. to 350° C. at a rate of 5° C./min and the glass transition temperature (maximum tan δ) and the Young's modulus (storage modulus) at 25° C. and 250° C. were determined.

Determination of Peel Strength Against Silicon Chip

Each of the resin solutions obtained in the Synthesis Examples was applied by a knife coater to the roughened surface of a 35 μm-thick electrolytic copper foil (Foil 3EC-III, Rz=6.0 μm; available from Mitsui Mining and Smelting Co., Ltd.) to a dry thickness of 60 μm and heated successively at 80° C. for 15 minutes, at 180° C. for 5 minutes and at 270° C. for 5 minutes to give an adhesive-coated copper foil. The mirror-finished surface of a single crystal silicon chip with an area of 1×1 cm was bonded to the adhesive-coated copper foil at 320° C. and 2 MPa for 10 seconds in a thermocompression bonding apparatus. The bonded specimen was mounted in a tensile tester, the adhesive-coated copper foil was pulled off at a rate of 50 mm/min and the peel strength in the 90-degree direction was determined at room temperature.

Test for Heat Resistance in Infrared Reflow Oven

A test specimen was prepared by bonding a silicon chip with an area of 1×1 cm to a polyimide adhesive-coated electrolytic copper foil (Foil 3EC-III, Rz=6.0 μm; available from Mitsui Mining and Smelting Co., Ltd.) at 300° C. and 2 MPa for 10 seconds in a thermocompression bonding apparatus. The specimen was kept in a constant-temperature constant-humidity apparatus at 85° C. and 85% humidity for 168 hours and allowed to absorb moisture, then heated in an infrared reflow oven at 260° C. for 60 seconds and the heat resistance was evaluated by observing the interface between the silicon chip and the adhesive-coated copper foil for the presence or absence of blisters.

Determination of Linear Expansion Coefficient

A specimen of the resin film measuring 3 mm×15 mm was mounted in an apparatus for TMA and submitted to the tensile test while adding a load of 5.0 g to the specimen and raising the temperature at a specified rate in the range from 30° C. to 350° C. . The linear expansion coefficient was determined from the relationship between the elongation of the resin film and the temperature. The TMA curve shows a rapid change at the softening point and the linear expansion coefficient determined in the temperature range below the softening point was designated as α1 and that above the softening point as α2.

SYNTHESIS EXAMPLE 1

In a Dean Stark reactor equipped with a stirrer and a nitrogen inlet tube were placed 71.59 g (0.2308 mole) of ODPA and 130 g of triglyme, 100.00 g (0.1316 mole) of PSX was added from a dropping funnel under a nitrogen atmosphere and the mixture was stirrer at room temperature for approximately 2 hours. The reaction mixture was then heated at 190° C. for 15 hours with stirring under a nitrogen atmosphere while removing the condensed water. The reaction mixture was then cooled to room temperature, 28.41 g (0.0992 mole) of DA5MG and 150 g of triglyme were added, the mixture was heated at 40° C. with stirring for approximately 2 hours under a nitrogen atmosphere and triglyme was added further to give polyimide precursor resin solution 1 with its solid content adjusted to 35% by weight.

SYNTHESIS EXAMPLE 2

Polyimide precursor resin solution 2 with a solid content of 35% by weight was prepared as in Synthesis Example 1 except changing the amount of monomers and using 82.21 g (0.2648 mole) of ODPA, 70.00 g (0.0978 mole) of PSX and 47.84 g (0.1671 mole) of DA5MG.

SYNTHESIS EXAMPLE 3

Polyimide precursor resin solution 3 with a solid content of 35% by weight was prepared as in Synthesis Example 1 except changing the kind and amount of monomers and using 107.17 g (0.3455 mole) of ODPA, 40.00 g (0.1610 mole) of PSX (n=1) and 52.83 g (0.1845 mole) of DA5MG.

SYNTHESIS EXAMPLE 4

Polyimide precursor resin solution 4 with a solid content of 35% by weight was prepared as in Synthesis Example 1 except changing the kind and amount of monomers and using 108.54 g (0.3499 mole) of ODPA, 40.00 g (0.1610 mole) of PSX (n=1) and 51.46 g (0.1889 mole) of DA4MG.

SYNTHESIS EXAMPLE 5

Polyimide precursor resin solution 5 with a solid content of 35% by weight was prepared as in Synthesis Example 1 except changing the kind and amount of monomers and using 104.40 g (0.3552 mole) of BPDA, 40.00 g (0.1610 mole) of PSX (n=1) and 55.72 g (0.1942 mole) of DA5MG.

SYNTHESIS EXAMPLE 6

Polyimide precursor resin solution 6 with a solid content of 35% by weight was prepared as in Synthesis Example 1 except changing the kind and amount of monomers and using 67.72 g (0.2182 mole) of ODPA, 100.00 g (0.1396 mole) of PSX and 32.34 g (0.0786 mole) of BAPP.

SYNTHESIS EXAMPLE 7

Polyimide precursor resin solution 7 with a solid content of 35% by weight was prepared as in Synthesis Example 1 except changing the kind and amount of monomers and using 67.84 g (0.2186 mole) of ODPA, 120.00 g (0.1676 mole) of PSX and 10.24 g (0.0510 mole) of DAPE.

EXAMPLES 1–7

Polyimide precursor resin solutions 1–7 obtained in the aforementioned Synthesis Examples were tested for the adhesive strength, heat resistance in a infrared reflow oven, glass transition temperature, Young's modulus and linear expansion coefficient. The results are shown in Table 1.

TABLE 1

|  | Example | | | | | Example (Comparative) | |
| --- | --- | --- | --- | --- | --- | --- | --- |
|  | 1 | 2 | 3 | 4 | 5 | 6 | 7 |
| Precursor resin solution | 1 | 2 | 3 | 4 | 5 | 6 | 7 |
| Tg (° C.) | 48 | 70 | 115 | 114 | 151 | 40 | 50 |
| Modulus of elasticity at 25° C. (MPa) | 415 | 730 | 2100 | 1900 | 4920 | 148 | 210 |
| Modulus of elasticity at 250° C. (MPa) | 26 | 32 | 60 | 45 | 470 | U. D. | U. D. |

TABLE 1-continued

|  | Example | | | | | Example (Comparative) | |
| --- | --- | --- | --- | --- | --- | --- | --- |
|  | 1 | 2 | 3 | 4 | 5 | 6 | 7 |
| Adhesive strength (kN/m) | >1.0 | >1.5 | >2.0 | >1.5 | >1.5 | >3.0 | >1.5 |
| TMA α 1 (ppm) | 135 | 137 | 79 | 66 | 58 | 1270 | 1110 |
| TMA α 2 (ppm) | 215 | 215 | 156 | 154 | 162 | 5341 | 6590 |
| Heat resistance in infrared reflow oven | N. B. | N. B. | N. B. | N. B. | N. B. | B. | B. |

U. D.: Unable to determine
N. B.: No blistering
B.: Blistering

EXAMPLE 8

Carbon black was incorporated in polyimide precursor resin solution 1 obtained in Synthesis Example 1 at a ratio of 2%, 5% and 10% by weight respectively and formed into a 50 μm-thick polyimide film in accordance with the test method described above for "Determination of glass transition temperature Tg and Young's moduluis E'." Three kinds of polyimide films thus prepared, respectively at the polyimide to carbon black ratio of 98:2, 95:5 and 90:10 by weight, showed a good surface condition and good laser printability by $CO_2$, YAG and green lasers. When measured for the transmission in the range of 350–3,000 nm, the polyimides showed a transmission of 1% or less in this range.

The polyimide resin of this invention, because of its thermoplastic properties, can be bonded by thermocompression at high temperature even after subjection to thermal hysteresis in the manufacturing step of electronic parts and shows good adhesiveness against silicon chips and conductors on wiring boards. Furthermore, it shows a high modulus of elasticity, particularly at high temperature, and good heat resistance in reflow and it can be used widely as an adhesive material for electronic parts, especially in the manufacture of semiconductor packages.

What is claimed is:

1. A polyimide resin which is obtained from an aromatic tetracarboxylic acid dianhydride (A) and a diamine (B) comprising 40–70 mol % of an aromatic diamine having an aliphatic straight chain (B1) represented by the following general formula (1)

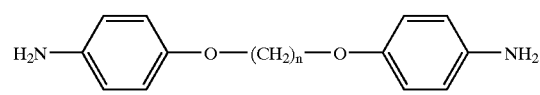

(1)

(wherein n is 3–10 denoting the average number of repeating units) and 30–60 mol % of a siloxanediamine (B2) represented by the following general formula (2)

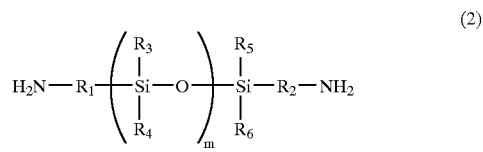

(2)

(wherein $R_1$ and $R_2$ are divalent hydrocarbon radicals, $R_3$–$R_6$ are hydrocarbon radicals containing 1–6 carbon atoms and m is 1–10 denoting the average number of repeating units) as essential components, and wherein the polyimide resin has a glass transition temperature of 30–200° C.

2. A polyimide resin as described in claim 1 wherein the polyimide resin has the following properties:

(1) The Young's modulus (storage modulus) at 250° C. is $10^6$ Pa or more; and (2) When a film of the polyimide is subjected to thermal hysteresis at 270° C. for 5 minutes and then bonded by thermocompression to the mirror-finished surface of a silicon chip adherend at 320° C. and 2 MPa, the peel strength between the silicon chip adherend and the polyimide film at room temperature is 0.8 kN/m or more.

3. A polyimide resin as described in claim 2 wherein the polyimide resin is used as an adhesive.

4. A polyimide resin composition which comprises 99.5–90% by weight of the polyimide resin described in claim 1 and 0.5–10% by weight of a pigment.

* * * * *